United States Patent [19]

Tarui et al.

[11] 3,853,644

[45] Dec. 10, 1974

[54] TRANSISTOR FOR SUPER-HIGH FREQUENCY AND METHOD OF MANUFACTURING IT

[75] Inventors: Yasuo Tarui, Tokyo; Toshihiro Sekigawa, Yokohama; Yutaka Hayashi, Tokyo, all of Japan

[73] Assignee: Kogyo Gijutsuin, Tokyo-to, Japan

[22] Filed: Sept. 7, 1972

[21] Appl. No.: 286,880

Related U.S. Application Data

[63] Continuation of Ser. No. 36,608, May 12, 1970, abandoned.

[30] Foreign Application Priority Data

Sept. 18, 1969 Japan .............................. 44-73846
Sept. 18, 1969 Japan .............................. 44-73850

[52] U.S. Cl. .................... 148/175, 29/571, 29/576, 29/580, 148/190, 148/191, 357/23, 357/35, 357/56

[51] Int. Cl. ........................ H01l 7/44, H01l 29/78

[58] Field of Search .......... 148/175, 187, 190, 191; 29/571, 576, 580; 317/234, 235

[56] References Cited

UNITED STATES PATENTS

| | | | |
|---|---|---|---|
| 3,370,995 | 2/1968 | Lowery et al. | 148/175 |
| 3,511,724 | 5/1970 | Ohta | 148/190 X |
| 3,558,375 | 1/1971 | Engeler | 148/175 |
| 3,577,045 | 5/1971 | Engeler et al. | 317/235 |
| 3,655,457 | 4/1972 | Duffy et al. | 148/1.5 |
| 3,740,276 | 6/1973 | Bean | 148/175 |

FOREIGN PATENTS OR APPLICATIONS

| | | | |
|---|---|---|---|
| 1,045,429 | 10/1966 | Great Britain | 317/235 |

OTHER PUBLICATIONS

Statz, H., "Increasing the Yield–Semiconductor Components," IBM T.D.B., Vol. 9, No. 7, Dec. 1966, p. 914.

*Primary Examiner*—L. Dewayne Rutledge
*Assistant Examiner*—W. G. Saba
*Attorney, Agent, or Firm*—Robert E. Burns; Emmanuel J. Lobato; Bruce L. Adams

[57] ABSTRACT

An insulated gate field effect transistor with very small drain capacitance is made by forming as a layer on a substrate of semiconductor material a first region containing impurities of opposite conductivity types with different concentrations and different diffusion characteristics. A recess formed in the first region is filled with semiconductor material by epitaxial growth to form a second region and impurity from the first region is heat diffused into a contiguous portion of the second region to form an intermediate base region the width of which is determined by differences in diffusion distances of the two impurities of opposite type. Also a transistor with a very small collector capacitance is made by masking a surface of a semiconductor body containing impurity of a first conductivity type, forming a window in said mask, hollowing out a recess through the window, partially filling the recess by epitaxial deposit with semiconductor material of the opposite type to form a first region containing a concentration of impurity of the first type with a higher diffusion coefficient than the impurity of the opposite type, epitaxially depositing further material in the recess to form a second region and heat diffusing impurity from said first region into a contiguous portion of said second region to form an intermediate base region the thickness of which is determined by the difference in diffusion distances of the impurities.

5 Claims, 17 Drawing Figures

TRANSISTOR FOR SUPER-HIGH FREQUENCY AND METHOD OF MANUFACTURING IT

This is a continuation of application Ser. No. 36,608, filed May 12, 1970, now abandoned.

BACKGROUND OF THE INVENTION

The present invention relates to improved transistors for super-high frequency and to a method of manufacturing them, more particularly to an insulated gate type field-effect transistor (hereinafter referred to as IGFET having improved characteristics of high-frequency and high-speed and to a method of manufacturing them.

Generally, when, in an insulated gate FET, its channel length becomes as small as the base width of a bipolar transistor, a channel cut-off frequency higher than that of bipolar transistor can be theoretically obtained. In obtaining such a small channel length, when a method wherein the channel length is determined by a photoengraving technique or by the thickness of an epitaxial grown region, as the conventional MOS type transistor, is adopted, it is difficult to obtain & channel length less than 1 $\mu$ for the limit of accuracy of the photoetching technique or accuracy and controllability of the epitaxial growth process.

Assuming that a method wherein the channel length is determined by the difference of diffusion lengths by double-diffusion is utilized, it is possible to obtain a channel length less than 0.1$\mu$ with improved accuracy, to obtain a channel cut-off frequency of several tens of GHz and to largely widen the frequency range of the insulated gate type FET. However, in a FET having such a small channel length, it is necessary to set the resistivity of the drain region adjacent to the channel higher than that of the latter to prevent a change of the channel length due to the drain voltage, so that it is also necessary to make the semiconductor substrate a drain for manufacturing the FET by an ordinary diffusion method. Accordingly, the drain area becomes large, and particularly an isolation capacitance of FET's which are built in an integrated circuit becomes large.

In the case of performing a linear amplification, it is possible to prevent an effect on the frequency characteristics by using the above-mentioned isolation capacitance as a tuning capacitance, but it disturbs high-speed operation in a circuit to handle pulses. A deficiency whereby the drain area becomes large results from the forming of the drain region before formation of the source region.

In addition, transistors for integrated circuits as shown in FIGS. 6 and 7 have been conventionally well known. Referring to FIGS. 6 and 7, numerals 6-1, 6-2, 6-3 and 6-4 designate the emitter region, collector region, base region, and substrate, respectively. The high frequency characteristics of the transistor as shown in FIG. 6 are principally determined by the width W*b* of the main base region 6-31 and the smaller the width W*b* is the better are the characteristics described above. It is noted that, in the transistors for integrated circuits, the width W*b* is controlled by the difference between diffusion distances of impurities with a good accuracy, and sufficient high-frequency characteristics can be obtained.

However, in the structure of FIG. 6 the collector region 6-2 becomes very large, giving rise to the deficiency of a high junction capacitance Cos between the collector region 6-2 and the substrate 6-4. That is, although the substrate 6-4 is grounded for electrically isolating the transistors, a large capacitance Cos is inserted as a portion of a load capacitor when the transistors are utilized as emitter grounding type. Consequently, the high frequency characteristics of the circuit are remarkably lowered.

On the other hand, there is a lateral transistor a section of which is shown in FIG. 7 as a transistor for an integrated circuit, the junction capacitance Ccb of which between the collector and the base is small. In this FIG. 7, numerals 6-1, 6-2, 6-3, 6-31 and 6-4 designate like portions in FIG. 6, respectively. In this case, since the base width W*b* is determined by the relative position of emitter region 6-1 and the collector region 6-2, it is very difficult to make the base width Wb less than 1$\mu$ in view of the limit of accuracy of the photoengraving technique. Accordingly, under the present conditions, lateral transistors having sufficiently good high-frequency characteristics cannot be obtained.

SUMMARY OF THE INVENTION

It is therefore an object of the present invention to make an area of drain region small even when a channel length has been made sufficiently small, thereby providing an insulated gate type FET having excellent pulse signal characteristics.

Another object of the present invention is to provide a transistor in which a drain region is disposed near a surface area of a semiconductor body by forming the drain region after formation of a source region, thereby providing an insulated gate type FET the drain area and capacitance of which between the drain region and other portions are reduced.

A further object of the present invention is to provide a FET applicable to a super-high speed pulse circuit and a circuit for millimeter waves.

A still further object of the present invention is to obtain a transistor for integrated circuits in which the base width of the base region is sufficiently thin, and the capacitance between the collector region and the substrate is nearly zero, and in which the capacitance between the collector region and the base region is small.

A still further object of the present invention is to provide a transistor for integrated circuits having excellent high-frequency characteristics in which the base width of the base region can be controlled by the difference between diffusion lengths of impurities. The foregoing objects and other objects of the invention have been attained by forming on a semiconductor substrate of a first conductivity type a first layer region of a second conductivity type and which contains an impurity of the first conductivity type, forming a recess through the first layer region to expose the substrate, refilling the recess with semiconductor material having the second conductivity type, and heat diffusing the impurity of the first conductivity type contained in the first region into the semiconductor material in the refilled region. Furthermore by manufacturing a transistor in which a base width of the base region is determined by the difference between the diffusion distances of impurities, and a collector region is surrounded by only the base region in the crystal of semiconductor.

Characteristic features and functions of the invention will be described in a more understandable manner in connection with the accompanying drawings, in which the same or equivalent members are indicated by the same numerals and characters.

DETAILED DESCRIPTION OF THE INVENTION

The present invention relates to improved transistors for superhigh frequency and to a method of manufacturing them, more particularly to a transistor with very small drain or collector capacitance realized by an epitaxial drain or collector deposited after source or emitter region formation.

Figure 1:
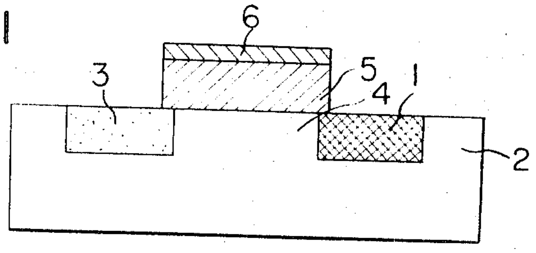
FIGS. 1 and 2 are sectional side views of a part of a conventional insulated gate type FET.
Figure 2:
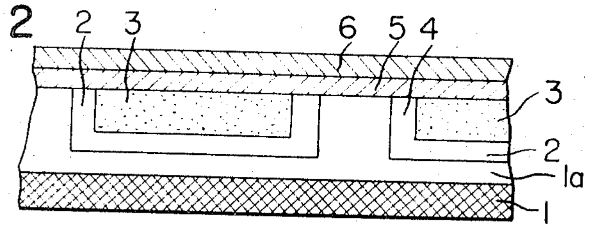
Figure 3:
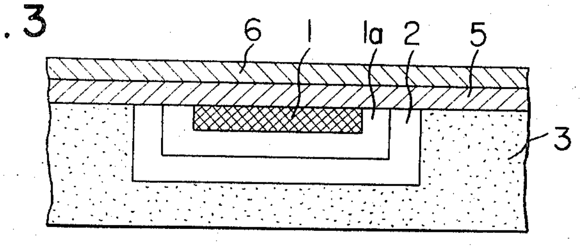
FIGS. 3 and 4 are sectional side views of a part of examples according to the invention.

Referring to the examples shown in the drawings according to the invention, in FIG. 3, there is shown an insulated gate type FET in which a drain region is disposed near the surface of the transistor element and the area of the drain region is limited to a minimum. Drain regions 1 and 1*a* are completely surrounded by base region 2, thereby forming a structure of self-separation type. Furthermore, considering the electric current path of this transistor, all the paths, that is drain-channel-source are formed along the surface of the semiconductor, and when high speed pulses or microwaves pass along them, there is little trouble caused by distributing elements, because the distances from each surface of the source and the drain electrode to the current paths mentioned above are very short.

The following description will illustrate a method for manufacturing transistors described above. Although it is described as to an n channel IGFET, it will be apparent that the above description will be similarly applied to a p channel IGFET only by substituting n type for p type. In FIG. 3, n type impurity having a small diffusion constant D and high concentration, for example, antimony (Sb) and p type mipurity having a large diffusion constant D and low concentration, for example, boron (B) are introduced into a semiconductor substrate to form an n type region 3. This will become a source region after processing. Next, a recess is formed in the substrate by selective etching. An etching mask formed of $Sio_2$ in the conventional manner may be used, and an opening is formed through the etching mask by selective photoengraving to expose the substrate and to determine the location of the recess. The recess is refilled by successive selective epitaxial growth to form a lightly doped n region 1*a* and a heavily doped n type region 1 contained wholly in the region 1*a*. The region 1a will become the drain region and the region 1 will become the drain contrast region. By processing as mentioned above and succeeding heat-treatment, p type impurity contained in source region 3 is diffused into base region 2 in which a channel is formed. Thereafter an insulating film 5 and a metal gate 6 are formed on the surface of channel, drain region and source region, thereby completing main region of transistor. That is, since the channel length of the transistor is determined only by means of diffusion process, the channel length mentioned above can be sufficiently reduced and the area of the drain region can be reduced also.

Figure 4:
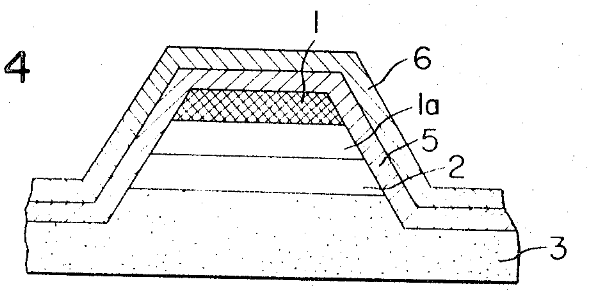

FIG. 4 illustrates a transistor element fabricated by the simple method according to this invention, wherein source region 3 has $n^+$ type. This $n^+$ type source region 3 contains a p type impurity which is lower in concentration and has a higher diffusion constant than the n type impurity contained in the source region 3. An n type drain region 1*a* and an $n^+$ type drain contact region 1 are formed on this source region by the epitaxial growth process or the diffusion process thereafter only the necessary portion of the drain region is left by removing the other portion of it by means of selective photoengraving process, and then an insulating film 5 and a metal gate 6 are formed on the surface of the remained portion mentioned above, thereby completing the main region of transistor.

Figure 5:
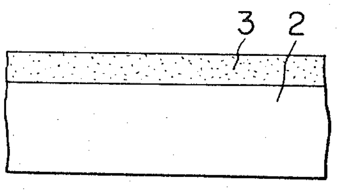
FIGS. 5*a* through 5*c* are views explaining successive processing steps adapted to manufacture the transistor according to the invention.
Figure 5:
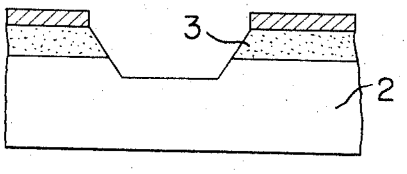
Figure 5C:
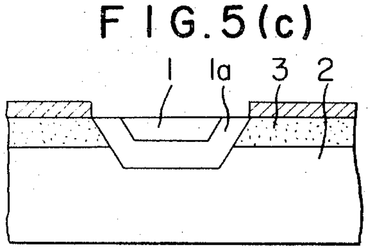
Figure 5D:
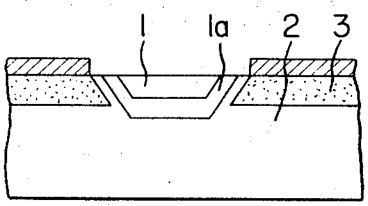
Figure 5E:
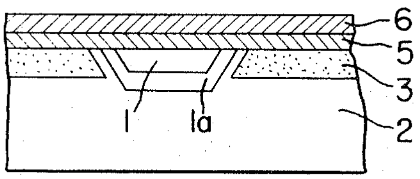

FIGS. 5(*a*) through (*e*) show processing steps to fabricate a transistor in which base region 2 is utilized as a substrate. On the base region 2 which contains a p type impurity, for example, boron (B) having a large diffusion constant D, a semiconductor region 3 which contains same type impurity as that of base region 2 and an n type impurity, for example, antimony (Sb) having a heavy concentration and a small diffusion constant D is formed, as shown in FIG. 5(*a*), by means of the epitaxial growth process or the diffusion process. Thereafter, a portion in which a drain region will be formed is removed, as shown in FIG. 5(*b*), by means of selective photoengraving process, subsequently drain regions 1a and 1 with n type impurities are formed, as shown in FIG. 5(*c*), by means of the epitaxial growth process. During the abovementioned epitaxial growth process and succeeding heat treatment, boron (B) is diffused from the base region 2 and the source region 3 into $n^-$ type drain region 1a to form a base region wherein a channel will be made as shown in FIG. 5(*d*). Thenafter, an oxide film 5 and a gate metal 6 are formed, as shown in FIG. 5(*e*), on the surface of the channels, drain regions and source regions, thereby completing the main operational region of transistor.

Figure 6:
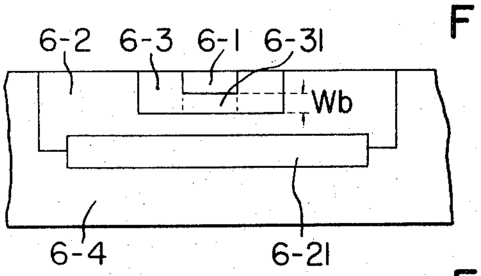
FIGS. 6 and 7 are sectional side views of a part of conventional transistors for integrated circuits.
Figure 7:
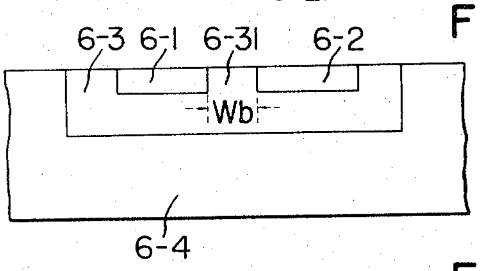
Figure 8:
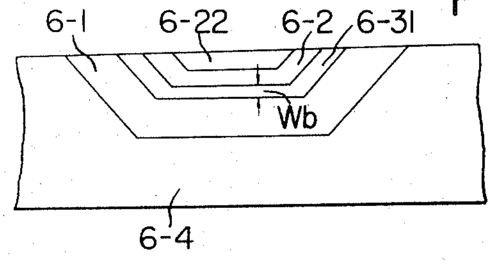
FIG. 8 is a sectional side view of a part of example according to the invention.
Figures 9A, 9B, 9C, 9D, 9E:
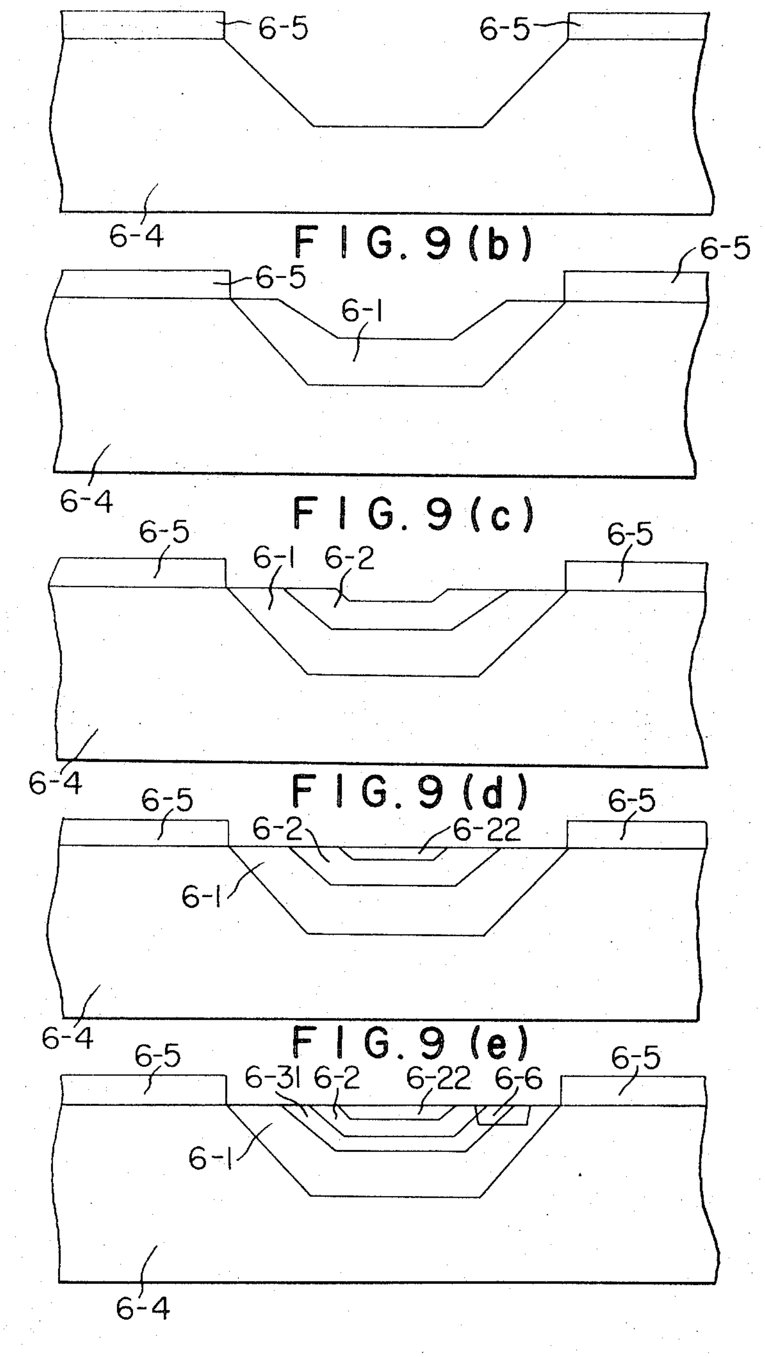
FIGS. 9*a* through 9*c* are views explaining successive processing steps adapted to manufacture the transistor illustrated in FIG. 8.

FIG. 8 illustrates a sectional side view of a transistor for integrated circuits according to the invention. Herein, the transistor mentioned above comprises an emitter region 6-1, a collector region 6-2, a main base region 6-31, a substrate 6-4 and a region 6-22 for collector contact having a larger impurity concentration than that of the collector region 6-2. That is, since in this structure the collector region 6-2 is shielded by the main base region 6-31 and the emitter region 6-1, capacitance between the collector region 6-2 and the substrate 6-4 is very small comparing with that in the structure shown in FIG. 6 and a collector having just the same dimension as that of the conventional emitter can be obtained, accordingly a junction capacitance between the collector and the base is small also.

On the other hand, the base width W*b* of the main base region 6-31 can be controlled by means of the difference between diffusion distances due to impurities so that this structure can be utilized as a transistor for integrated circuits having an excellent high-frequency characteristics.

FIGS. 9*a* to 9*e* illustrate another example of processing steps for fabricating a structure as shown in FIG. 8, wherein it is described as to npn type transistor. First of all, a substrate of p type semiconductor is hollowed out by selective photoengraving process (FIG. 9(*a*)) wherein an insulating film 6-5 is used as a mask, subsequently a region 6-1 is formed by the epitaxial growth process (FIG. 9(*b*)), wherein the region 6-1 is formed so as to be n type semiconductor which contains p type impurity and has the large impurity concentration.

In this case, the p type impurity having a larger diffusion coefficient than that of n type impurity is utilized.

Thereafter n type semiconductor region 6-2 of which impurity concentration is smaller than that of p type impurity contained in the region 6-1 is formed on the region 6-1 by means of the epitaxial growth process (FIG. 9(*c*)) and an n type region 6-22 having a larger impurity concentration than that of the region 6-2 is formed on the region 6-2 (FIG. 9(*d*)). Next, applying a heat diffusion process to body shown in FIG. 9(*d*), p type impurity in the region 6-1 is diffused into the region 6-2, therein p type semiconductor region 6-31 is formed between the region 6-1 and the region 6-2, simultaneously a region 6—6 for the base electrode contact is formed by the $p^+$ type diffusion process (FIG. 9(*e*)), thereafter each of electrodes is fitted on the predetermined portions of the structure. The region 6-31 mentioned above is formed by utilizing the difference of the diffusion distances of the p type impurity contained in the region 6-1 and the n type impurity, so that its width $W_b$ can be freely controlled with accuracy of less than 0.1 $\mu$ by adjusting temperature and time of processing, thus an improved transistor in which its base width is small, its capacitance between the collector region and the substrate is nearly zero, and its junction capacitance between the collector and the base is very small can be obtained.

What we claim is:

1. A method of manufacturing an insulated gate field effect transistor, which comprises the steps of:

providing as a source region a semiconductor body of a first conductivity type containing two kinds of impurities which are opposite in conductivity type and different in concentration and in diffusivity, the impurity lower in concentration having greater diffusivity and a second conductivity type opposite the first conductivity type, removing a portion of said source region to form a recess therein, filling said recess by successive epitaxial growth to form a lightly doped drain region of the first conductivity type and a heavily doped drain contact region of the same conductivity type as said drain region, diffusing by heat treatment said impurity contained in said source region and lower in concentration and higher in diffusivity into a part of said drain region adjacent to said source region to form a base region between said source and drain regions, applying a gate insulator over said semiconductor body and applying a gate electrode over said insulator, a channel being induced in the surface of said base region by field applied from said gate electrode through said insulator, the length of said channel being determined only by the diffusion length of said diffused impurity.

2. A method of manufacturing an insulated gate field effect transistor which comprises the steps of forming as a layer on a substrate of semiconductor material which contains an impurity of a first conductivity type, a first region containing an impurity having a high diffusion characteristic of the same type as said substrate and an impurity of the opposite conductivity type having a high concentration and low diffusion characteristic, providing a mask over said first region, providing a window in said mask, forming through said first region a recess to expose said substrate through said window, successively depositing in said recess by epitaxial growth through said window lightly doped second and heavily doped third regions of semiconductor material of said opposite conductivity type, said third region being isolated from said first region by said second region, effecting by heat diffusion a diffusion of impurity of said first conductivity type from said first region into said second region to form between said first and second regions a base region the width of which is determined by the difference in diffusion of said impurities of said first conductivity type and said second conductivity type, applying a gate insulator over said first and third region and applying a gate electrode over said insulator.

3. A method of manufacturing a transistor, which comprises the steps of providing a mask on a surface of a semiconductor body containing an impurity of a first conductivity type, forming a window in said mask, hollowing out a recess in said body by a selective photoengraving process through said window, partially filling said recess by epitaxial growth through said window with semiconductor material of the opposite conductivity type to form a first region containing a, small impurity concentration of said first impurity type with a higher diffusion coefficient than that of said opposite impurity type, additionally depositing in said recess by epitaxial growth through said window semiconductor material of said opposite opposite conductivity type with an impurity concentration less than that of said first impurity type in said first region, further depositing on said second region by epitaxial growth through said window semiconductor material of said opposite conductivity type to form a third region having a larger impurity concentration than that of said second region, and effecting by a heat diffusion process a diffusion of impurity of said first conductivity type from said first region into said second region to form between said first and second regions a base region, the width of which is determined by the difference of the diffusion distances of said impurity of said first conductivity type contained in said first region and said impurity of said opposite conductivity type.

4. A method according to claim 3, further comprising diffusing impurity of said first conductive type into an exposed edge portion of said base region to provide a base electrode contact.

5. A method of manufacturing an insulated field effect transistor comprising:

a. providing as a source region a semiconductor substrate of first conductivity type containing two impurities of opposite conductivity type and different concentrations and diffusivities, the impurity having the second conductivity type opposite the first conductivity type being lower in concentration and having a greater diffusivity than the impurity having the first conductivity type;

b. forming on said substrate a lightly doped drain region of the first conductivity type and on said drain region a heavily doped drain contact region of the first conductivity type by successive epitaxial growth;

c. heating said substrate to effect diffusion of the second conductivity type impurity from said substrate into said drain region to form a base region therebetween; said base region having a width determined by the difference in diffusion of said first and second conductivity type impurities.

d. removing portions of said drain contact, drain, base and source regions and exposing a surface of said source region by selective etching so that remaining portions of said drain contact, drain and base regions and the underlying portion of said source region form a protrusion extending above the surface of said source region, said drain contact, drain, base and source regions being exposed along lateral surfaces of said protrusion;

e. disposing a gate insulator overlying the surfaces of said protrusion; and f. disposing a gate electrode overlying said gate insulator.

* * * * *